United States Patent [19]
Helinski et al.

[11] Patent Number: 6,024,266
[45] Date of Patent: *Feb. 15, 2000

[54] SYSTEM AND METHOD FOR TRANSPORTING AND CLAMPING FLEXIBLE FILM STRUCTURES

[75] Inventors: Edward Frank Helinski, Johnson City; Donald Wesley Henderson, Ithaca; David Erle Houser, Apalachin, all of N.Y.

[73] Assignee: International Business Machines Corporation, Armonk, N.Y.

[ * ] Notice: This patent is subject to a terminal disclaimer.

[21] Appl. No.: 09/179,862

[22] Filed: Oct. 28, 1998

Related U.S. Application Data

[63] Continuation of application No. 09/008,803, Jan. 16, 1998, Pat. No. 5,957,360.

[51] Int. Cl.⁷ .............................. B65H 23/06; B65H 59/14
[52] U.S. Cl. ........................ 226/147; 226/195; 242/419.6; 242/538.2; 242/615.12
[58] Field of Search .............................. 242/525.4, 535.2, 242/535.3, 538.2, 615.12, 419.6; 226/143, 150, 147, 195

[56] References Cited

U.S. PATENT DOCUMENTS

| | | | |
|---|---|---|---|
| 2,994,489 | 8/1961 | Hare | 226/195 X |
| 3,270,932 | 9/1966 | Smith Jr. | 242/615.12 X |
| 3,554,421 | 1/1971 | Streeter | 226/150 X |
| 3,724,045 | 4/1973 | Dryon . | |
| 3,744,693 | 7/1973 | Greiner | 242/615.12 |
| 3,964,355 | 6/1976 | Daniels . | |
| 4,218,030 | 8/1980 | Korzeniewski | 242/538.2 X |
| 4,542,842 | 9/1985 | Reba . | |
| 4,925,080 | 5/1990 | Crouse et al. | 242/615.12 |
| 5,069,558 | 12/1991 | Dinnebier et al. . | |
| 5,199,623 | 4/1993 | Rajala et al. . | |
| 5,406,869 | 4/1995 | Prochnow et al. . | |
| 5,423,468 | 6/1995 | Liedtke | 242/615.12 |
| 5,561,918 | 10/1996 | Marschke . | |

FOREIGN PATENT DOCUMENTS

| | | |
|---|---|---|
| 395877 | 5/1924 | Germany . |
| 2 044 658 | 10/1980 | United Kingdom . |

OTHER PUBLICATIONS

"Via Punching Device for Multi–Layered Ceramic Substrates," *IBM Technical Disclosure Bulletin*, vol. 32, No. 7, pp. 255–257, Dec. 1989.

"Mott Air Film Roll Engineering and Product Guide," Mott Industrial, DB 3100, Sep. 1996.

"Conveyor Device," DAS 1,121,027, R. Mohr, Apr. 1960.

*Primary Examiner*—Michael R. Mansen
*Attorney, Agent, or Firm*—Pollock, Vande Sande & Amernick

[57] ABSTRACT

One or more porous air film rolls are used, in a system to support a flexible web during movement of the web, and selectively provide either compliant or rigid clamping of the web while performing processing operations on the web at a work station. The present invention is particularly suitable for punching holes on-the-fly, in both "X" and "Y" directions, in a flexible polyamide film. Up to a four-fold increase in punch tool productivity is provided by the present invention.

20 Claims, 4 Drawing Sheets

SYSTEM AND METHOD FOR TRANSPORTING AND CLAMPING FLEXIBLE FILM STRUCTURES

CROSS-REFERENCE TO RELATED APPLICATIONS

This application is a continuation of U.S. application Ser. No. 09/008,803, files Jan. 16, 1998, which is now U.S. Pat. No. 5,957,360.

FIELD OF THE INVENTION

This invention relates generally to a system for transporting a film structure along a pathway and selectively clamping the film at a position along the pathway, and more particularly, to such a system that includes an plurality of air bearings to support the flexible film during transportation along the pathway and to provide for highly compliant and resilient clamping of the film or to provide for rigid clamping of the film structure.

BACKGROUND OF THE INVENTION

History of the Related Art

Many manufacturing and material processing operations involve carrying out various procedures on a segment of a continuous film or sheet. For example, polyimide tapes or webs are typically used as the dielectric layer in multi-layered substrates for electronic circuits. In this application, holes are punched through the polyimide film to provide vias through the film for the purpose of providing electrical communication between conductive layers separated by the film. Typically, in this application, the punched holes are required to be located within 10 µm (0.0005 in.) of any specified position. The punching operation may be carried in a move-stop-punch mode (MSP) or in a punch-on-the-fly X direction mode (POFX), or a punch-on-the-fly Y direction mode (POFY). When in the MSP mode, an X-Y translation table on which the punch and die assembly is supported, stops at the position to be punched before the punch actuator has fired. During the POFX and POFY modes, the X-Y table is in motion during punch actuator firing. In all three modes, the substrate is maintained at a stationery position. In the POFX and POFY modes, the relative velocity of the punch with respect to the film substrate is very significant. Hole quality requirements, i.e., the absence of tearing or adverse distortion of the hole size and shape, limit the punch and die assembly velocity with respect to the film. Distortion of the punched holes is a function of punch engagement time and the relative velocity (X-Y) between the punch and film. Distortion is also a function of the elastic properties of the film, the resiliency of the mounting or clamping system and the distance between clamping stations.

Heretofore, satisfactory hole quality, without adverse distortion, when punching holes in a thin polyimide film has been achievable at punch-die table speeds of up to about 10 mm/sec for POFX punching using rigid piston actuated clamps positioned in close proximity to the punch table. At higher velocities, hole quality becomes unacceptable. Since a large number of holes are generally punched in a specified pattern in each designated area of the continuous film, the limitation on punch table velocity with respect to the film imposes an undesirable limitation on the time required to process each designated area of the film.

The present invention is directed to overcoming the problems set forth above. It is desirable to have a clamping mechanism which will enable higher relative velocities and higher tool productivity. It is also desirable to have such a clamping mechanism that if desired, will compliantly maintain a preselected area of the continuous film at a preselected position. It is also desirable to have such a clamping arrangement that, when the film is being transported, supports the film on an air cushion as it passes through the clamping stations. Furthermore, it is desirable to have such a transport and clamping system that is capable of selectively resiliently and compliantly holding a designated film area at a desired position at the work station, or alternatively, rigidly clamping the film structure.

SUMMARY OF THE INVENTION

In accordance with one aspect of the present invention, a system for transporting a flexible film structure along a pathway and selectively clamping the film structure at a preselected position along the pathway includes a controllably movable work station adapted to perform predefined processing operations on the film structure, a first film support and clamping station spaced from a first side of the work station, and a second film support and clamping spaced from a second side of the work station. The first and second film support and clamping stations may each have a plurality of porous members that have a cylindrical wall portion in which a plurality of air passageways extend between an interior chamber of the respective porous member and a cylindrically-shaped outer surface of the cylindrical wall portion of each porous member. An air inlet port provides for communication between a source of compressed gas such as air and the internal chamber of each porous member. The flexible film structure is supported on an air cushion at each of the porous members in response to providing a flow of air into the interior chamber of the respective porous member, and clamped in a fixed position with respect to the respective film support and clamping station in response to interrupting the flow of air into the interior chamber of at least one porous member of the respective station.

Other features of the system for transporting and selectively clamping a flexible film structure include three of the porous members being arranged in a substantially parallel plane with respect to each other at the first and second film support and clamping stations. Additional features can include each of the porous members having a cover member disposed in covering relationship over the cylindrical wall portion of each respective porous member. Additional features can include the cover member having a multi-layered construction comprising a first porous layer disposed adjacent to the cylindrical wall portion of the porous member and having a plurality of closely spaced apertures that provided a predefined porosity characteristic, a second porous layer adjacently disposed over the first layer and having a porosity characteristic less than that of the first porous layer, and a third porous layer adjacently disposed over the second layer and having a porosity greater than that of the second porous layer. Alternatively, a single porous structure can be used such as a thin walled porous pipe.

Still other features of the system for transporting and selectively clamping a flexible film structure, in accordance with the present invention, may include the work station being controllably movable in a first direction parallel to the pathway along which the flexible film structure is transported, and in a second direction perpendicular to the pathway. An additional feature includes the work station being a punch and die assembly adapted to punch holes in a flexible film structure.

In accordance with another aspect of the present invention, a method for transporting a flexible film structure along a pathway extending in a preselected direction and selectively clamping the film structure at a position along the pathway designated for processing of the film structure, includes threading the flexible film structure in a serpentine manner over and under a first set of at least three adjacently disposed air film rolls, one which is distally spaced from the work station, one which is intermediately spaced from the work station, and one of which is proximally spaced from the work station. The flexible film structure is then threaded through a work station disposed at the designated position along the pathway. The flexible film structure is also threaded in a serpentine manner alternatingly over and under a second set of at least three adjacently positioned air film rolls, disposed along the pathway, one of the air film rolls being distally spaced from the work station, one being disposed at an intermediately spaced position from the work station, and one being proximally spaced from the work station. The first and second sets of air film roles are disposed on opposite sides of the work station. A supply of air is delivered a controlled pressure to one or preferably both of the air film rolls of the first and second sets of air film rolls whereby an air cushion is formed between an external surface of each of the air film rolls and a flexible film. The flexible film structure is then transported along the pathway, while simultaneously being supported on the plurality of air cushions, until a preselected area of a flexible film structure is positioned at the work station. Delivery of the air is then sequentially interrupted in a defined sequence to each of the air film rolls of the second set of air film rolls, and then sequentially interrupted in a defined sequence to each of the air film rolls of the first set of air film rolls. When the delivery of air is interrupted to the air film rolls, the flexible film moves into intimate contact with the external surface of each of the air film rolls, whereby the flexible film structure is substantially rigidly clamped at a fixed position between the first and second sets of air film rolls.

Other features of the method for transporting and selectively clamping a flexible film structure, in accordance with the present invention, include delivering a supply of air at a controlled pressure to one or preferably both of the proximally spaced air film rolls of the first and second sets of air film rolls. When air is delivered to the proximally spaced air film rolls while the delivery is interrupted to the intermediate and distally spaced rolls of each set, the flexible film structure is compliantly maintained at the desired preselected position.

Another feature of the method includes punching holes at predetermined sites on an electrically non-conductive plastic film having a thickness of from about 25 μm to about 50 μm.

BRIEF DESCRIPTION OF THE DRAWINGS

A more complete understanding of the structure and operation of the present invention may be had by reference to the following detailed description when taken in conjunction with the accompanying drawings, wherein.

DETAILED DESCRIPTION OF A PREFERRED EMBODIMENT OF THE INVENTION

In the following exemplary embodiments, a system 10 for transporting a flexible film structure 12 along a pathway extending in a preselected direction and selectively clamping the film structure 12 at a preselected position designated for processing of the film structure 12, in accordance with the present invention, is shown in a somewhat schematic fashion in FIGS. 1–3. In the illustrative embodiment described below, the flexible film structure 12 is a thin film of polyamide tape, or web, such as KAPTON® as commonly used to form dielectric layers in multi-layered flexible printed circuits adapted for the support of electrical components using tape ball grid array (TBGA) connection and mounting techniques. In some applications, the polyimide tape may have a relatively thin electrically conductive coating applied by sputter deposition, or other deposition technique, to one surface of the tape. Such thin flexible films, alternatively referred to as webs, tapes, elongated sheets, and the like, typically have elastic characteristics which make the film structure difficult to hold compliantly in a precise position during multiple punching operations. Such films are elastically stiff. The polyamide film used for the construction of multi-layered flexible circuits requires a large number of holes to be punched through the film so that, in subsequent operations, conductive material can be deposited through the holes to interconnect adjacent circuit elements disposed on each side of the flexible film. The circuit elements are very small, having closely spaced conductive features which require that the interconnecting holes be precisely positioned and have a well-controlled size and shape, without distortion. Typically, the polyamide film has a thickness of from about 25 μm (0.001 in.) to about 50 μm (0.002 in.).

Figure 1:
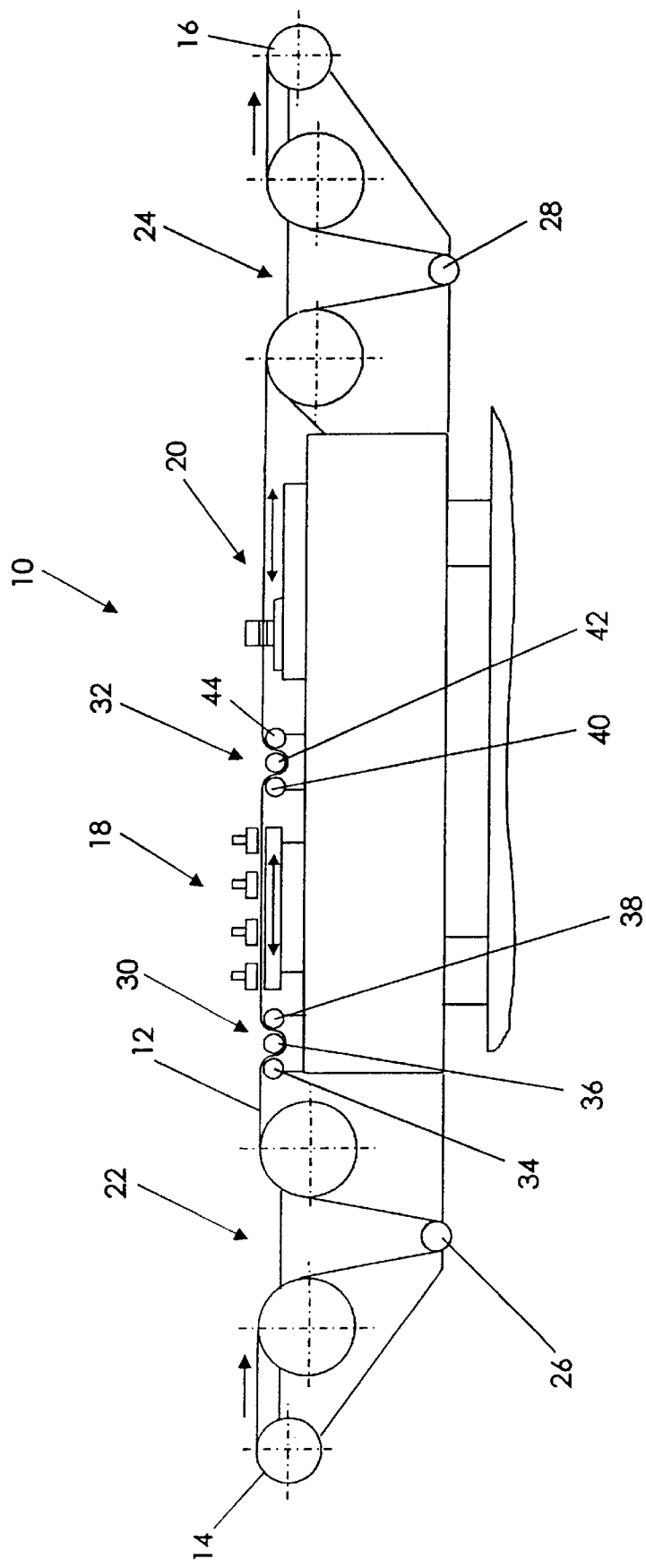
FIG. 1 is a schematic diagram of a processing system for forming apertures through a thin continuous-web film, in which the processing station includes a system for transporting and clamping a flexible film structure in accordance with the present invention.
Figure 2:
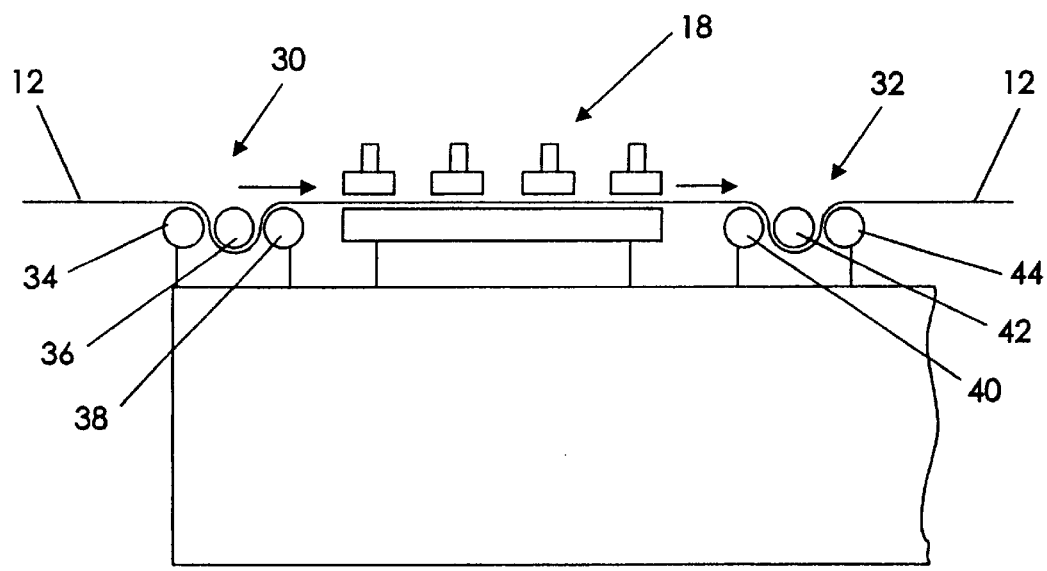
FIG. 2 is a schematic diagram of the system for transporting and clamping a film structure in accordance with the present invention, showing the film structure supported on an air cushion at each of a plurality of porous rolls during transportation of the air film.

A processing station for handling and precisely punching holes in a polyamide film, in accordance with the present invention, is shown in a somewhat schematic fashion in FIG. 1. A continuous web of the polyamide film 12 passes from a supply spool 14 to a take up spool 16 in a path which takes it through a punching station 18 and an incrementing station 20. A first tensioning station 22 is positioned on the supply side of the work station 18, and a second tensioning station 24 is positioned on the take up side of the work station 18, between the incrementing station 20 and the take up spool 16. Tensioning weights 26, 28 respectively act in a downward direction to provide a balanced downward force on each side of the punching station 18, resulting in a uniform tension in the web 12. In the illustrated embodiment, the incrementing station 20 comprises a table moveable in a direction along the pathway of the film structure 12, i.e., in an "X" direction, and has a clamp that is selectively moveable between an open and closed position to move the flexible film structure 12 in response to moving the moveable table when the clamp is closed on the film.

The work station 18 is adapted to perform predefined processing operations on the film structure 12 and, in the illustrative preferred embodiment, is controllably moveable in both a direction parallel to the pathway of the flexible film structure 12 and in a direction perpendicular to the pathway, i.e., in both the "X" and "Y" directions. Furthermore, in the illustrative embodiment adapted for punching a plurality of apertures, or holes, in a thin polyamide web, the work station 18 has a lower die portion that is positioned under the web 12 and an upper punch section that is positioned over the web. The punches are actuated by an electromagnetic repulsion actuator drive to punch through the web 12 and into the lower die to form holes in the web 12. The work station 18 is capable of moving the punch and die assembly in both the "X" and "Y" directions to move the punches from one location to another at any desired grid position. Linear scales are attached to the movable punching station 18 to sense the position of the die table and punches, enabling the punching station 18 to punch holes while on-the-fly in the "X" (POFX) direction or punch holes on-the-fly in the "Y" (POFY) direction. During POFX and POFY punching operations, the work station 18 is in motion during punch actuator firing. Prior to the present invention, the maximum travel rate of the punching station 18 when moving in the POFX or POFY directions was on the order of about 10 mm/sec. However, when the film 12 is transported and clamped using the film support and clamping stations described below, it is now possible to quadruple the travel speed of the punching station, enabling holes to be formed at desired grid positions, without adverse distortion, while traveling at rates up to 40 mm/sec.

Importantly, the present invention includes a first film support and clamping station 30 spaced from a first side of the work station 18 in a direction along the pathway of the flexible film structure 12, and a second film support and clamping station 32 that is spaced from a second side of the work station 18 in a direction along the desired pathway of the flexible film structure 12. As best shown in FIGS. 2 and 3, each of the clamping stations 30, 32 respectively include a plurality of porous members. In the illustrative preferred embodiment, the porous members are air film rolls having a construction described below in greater detail. The first film support and clamping station 30 has a set of three air film rolls that are adjacently positioned with respect to each other in substantially coplanar, parallel relationship along the pathway of the flexible film structure 12, and includes a first air film roll 34 distally spaced from the work station 18, an intermediately positioned air film roll 36 intermediately spaced from the work station 18, and a proximally positioned air film roll 38 proximally spaced from the work station 18. In like manner, the second film support and clamping station 32 includes a second set of adjacently positioned coplanar and parallel air film rolls disposed along the pathway of the flexible film structure 12 which comprise a proximally spaced air film roll 40 proximally spaced from the work station 18, an intermediately spaced air film roll 42 intermediately spaced from the work station 18, and a distally spaced air film roll 44 distally spaced from the work station 18.

Figure 3:
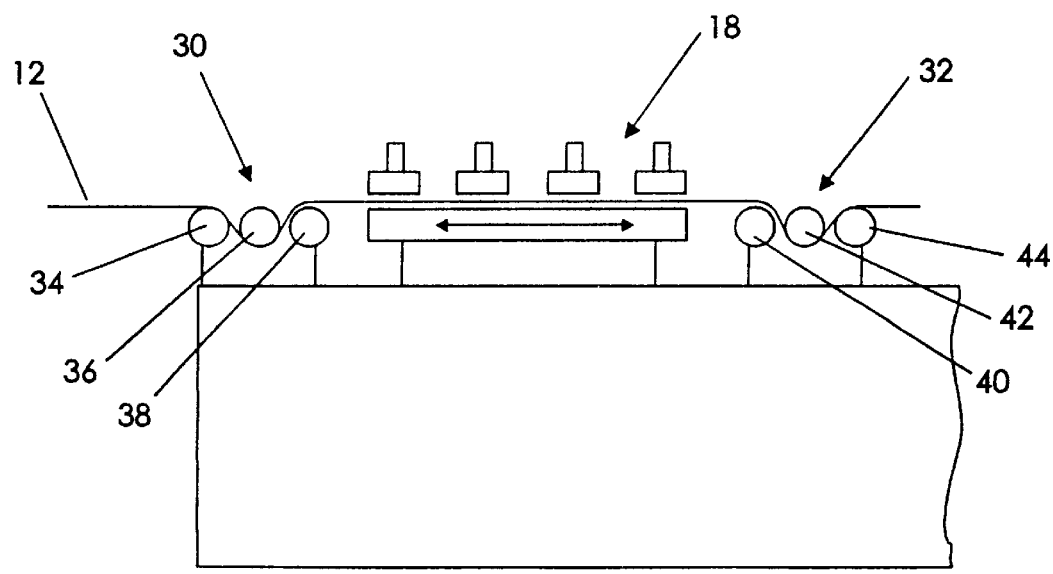
FIG. 3 is a schematic diagram of the system for transporting and clamping a film structure in accordance with the present invention, showing the flexible film structure clamped between two adjacent porous rolls on each side of the work station.
Figure 4:
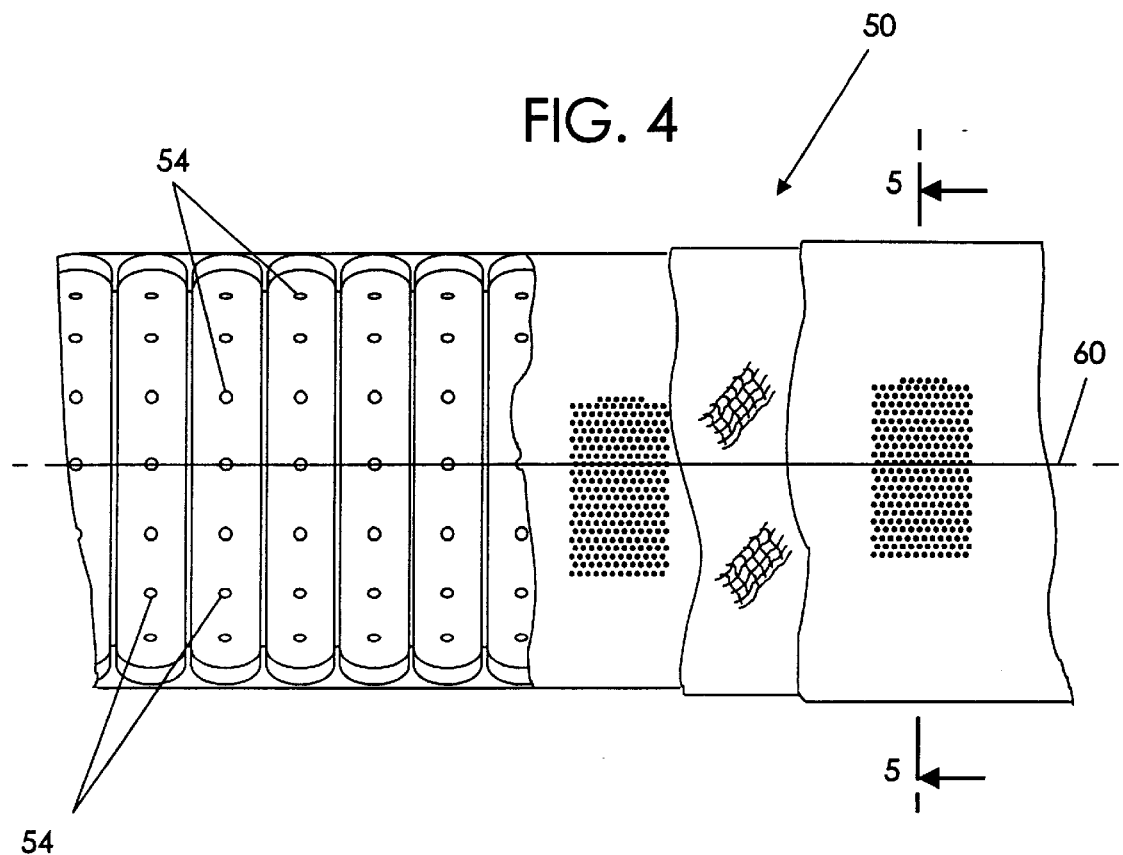
FIG. 4 is an elevational view of a porous member which forms an air film roll for selectively supporting and clamping the flexible film structure, in accordance with the present invention, with sections of a multi-layered outer cover of the porous member broken away to show details of the cover.
Figure 5:
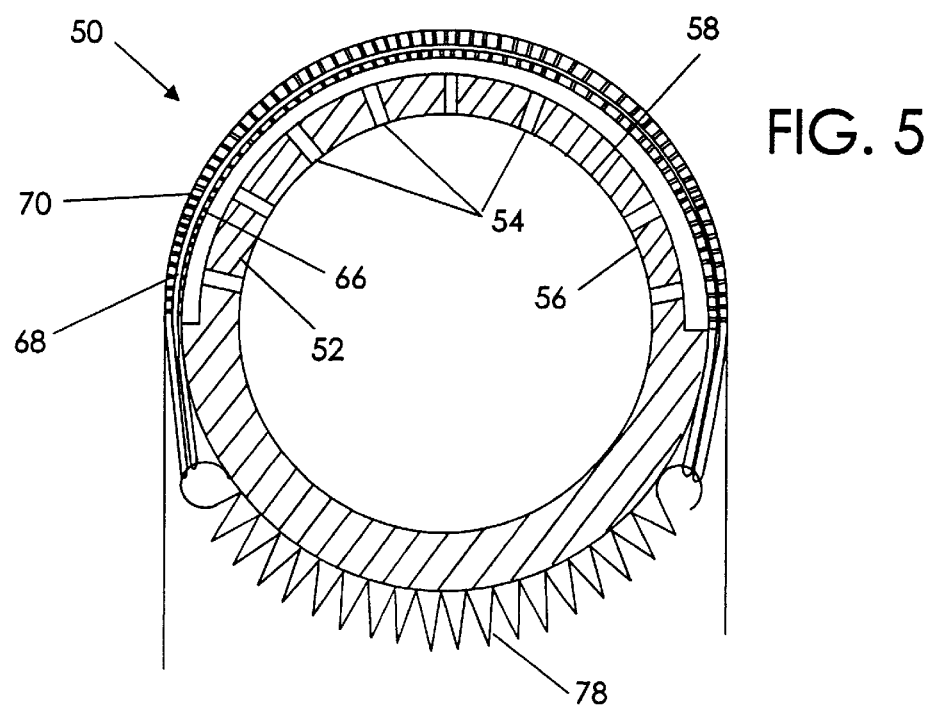
FIG. 5 is a cross-sectional view of the porous member, taken along the line 5—5 of FIG. 4.

Each of the air film rolls have a similar construction and are generally identified in FIGS. 4 and 5 by the reference numeral 50. The air film rolls 50 have a cylindrical wall portion 52, for example formed of aluminum tubing, and has a plurality of slots or holes 54 that extend between an interior chamber 56 and a cylindrically-shaped outer surface 58. Each of the porous air film rolls 50 also has a longitudinal axis 60 that extends in a direction parallel with the cylindrical wall portion 52 and in perpendicular relationship with the pathway along which the flexible film structure 12 is transported when arranged as shown in FIGS. 1–3. Each of the air film rolls 50 also has an air inlet port 62, as represented schematically in FIG. 6, that provides communication between a controlled source of compressed air 64 and the respective interior chamber 56 of each of the porous air film rolls 50.

In the illustrative preferred embodiment of the present invention, each of the porous air film rolls 50 has a multi-layered cover that serves to distribute the air passing through the holes 54 in the cylindrical wall portion 52 of the roll 50, and provides sufficient impedance to the free flow of air through the porous member so that uniform pressure may be maintained within the interior chamber 56 without requiring an excessive flow rate while simultaneously providing adequate flow to create an air cushion sufficient to support a flexible film structure 12 in spaced, non-contacting relationship with the porous air film roll 50. More specifically, the multi-layered cover member has a first porous layer 66 that is desirably formed of a thin stainless steel mesh having a thickness of about 0.1 mm (0.004 in.) and closely spaced small holes extending through the layer 66.

The multi-layered cover member has a second porous layer 68 that is sandwiched between the first porous layer 66 and a third, or outer, porous layer 70. Desirably, the second porous layer 68 provides a low porosity screen to provide the required impedance and uniform distribution of air between the first and third porous layers 66, 70. For example, the low porosity second porous layer 68 may be formed of a woven or sintered plastic material with low porosity and high impedance.

The third porous layer desirably has a construction that is identical, or at least similar to, that of the first porous layer 66, i.e., a thin stainless steel cover plate having a plurality of small holes on close spacing. It is desirable that the spacing of the holes in the third porous layer 70 be less than the spacing of holes that may be punched in the web 12 to assure uniform support of the web 12. For example, if the minimum spacing of holes in the web 12 is on the order of 1.3 mm (0.050 in.), then it is desirable that the spacing of the holes in the third porous layer 70 be on the order of 1.0 mm (0.040 in.) or less. Desirably, the holes in the third porous layer 70 have a small diameter, for example, on the order of about 0.18 mm (0.007 in.). The multi-layered sandwich construction of the cover member allows sufficiently high impedance without the difficulty of making ultra-small holes in the cover plate. The thin sandwich construction also allows each hole to act as a small independent air bearing, a requirement for supporting a web after many holes are punched through the web. As illustrated in FIG. 5, the multi-layered cover member may be secured in place over the active, or porous, cylindrical wall position 52 of each air film roll 50 by a spring 78.

Figure 6:
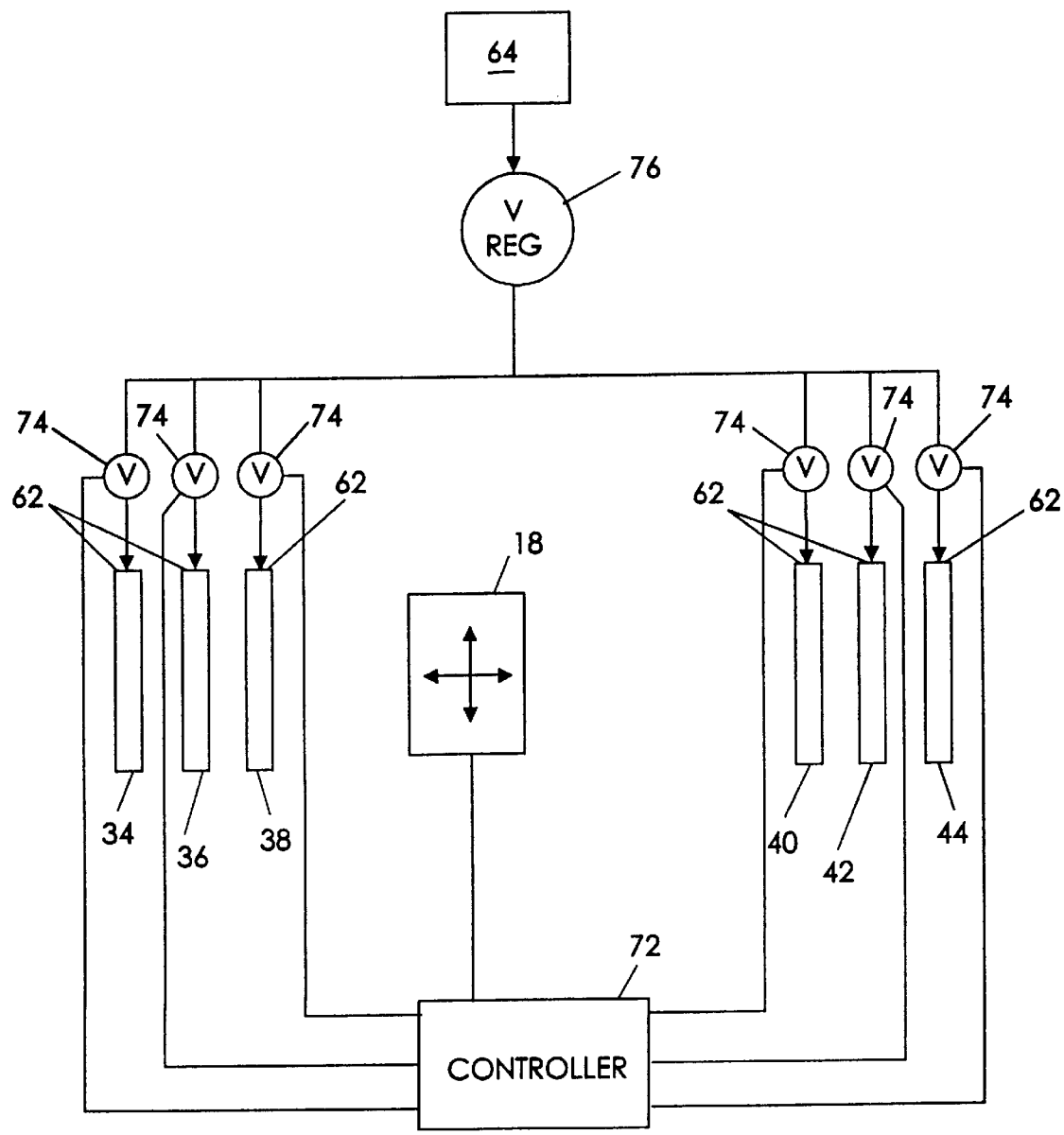
FIG. 6 is a schematic diagram of the control system for selectively delivering and interrupting a supply of compressed air to each of the porous members, in accordance with the present invention.

As shown in FIG. 6, a conventional programmable electronic controller 72, or similar automated control device, is used to actuate a valve 74 positioned between the source of compressed air 64 and each of the air film rolls 34, 36, 38, 40, 42, 44. The controller 72 is thus able to selectively and controllably provide a source of compressed air to the interior chamber 56 of each of the porous air film rolls or interrupt the flow of compressed air to the interior chambers 56 by opening or closing an associated valve 74. When air is provided to the interior chamber 56 of any of the air film rolls 34, 36, 38, 40, 42, 44, an air cushion is formed between the outer surface of the respective air film roll and the adjacently disposed surface of the flexible film structure 12. The air cushion thus supports the flexible film structure in controlled, non-contacting relationship with the respective air film roll. When the flow of compressed air to the interior chamber 56 of an air film roll is interrupted as a result of closing the respective full control valve 74, the corresponding air cushion between the air film roll and the flexible film structure 12 collapses and the air film structure is drawn into intimate contact with the other surface of the respective air film roll as a result of tensioning provided by a respective one of the first or second tensioning weights 26, 28. When air flow is interrupted to two adjacently disposed air film rolls, the flexible film structure, or web, 12 is wrapped around the adjacent rolls in such a manner as to provide secure clamping of the web 12. If desired, the controller 72 may also provide positioning control for the work station 18.

The operation of the system 10 for transporting and selectively clamping the flexible film structure 12 by selectively delivering a flow of air to the porous air film rolls or, alternatively, interrupting the flow of compressed air through the air film rolls, is described in the following paragraphs with respect to an explanation of the method for transporting and selectively clamping a flexible film structure.

Initially, the flexible film structure 12 is threaded in a serpentine manner, alternatingly over and under the porous air film rolls 34, 36, 38 at the first film support and clamping station 30, through the work station 18, and then in a like serpentine manner, alternatingly over and under the porous air film rollers 40, 42, 44 making up the second film support and clamping station 32. The clamp on the indexing station 20 is then closed, and each of the porous air film rolls 34, 36, 38, 40, 42, 44 are sequentially, internally pressurized by opening the corresponding valves 74 to provide a flow of pressurized air, for example of about 1.5 psi, which may be regulated by separate pressure regulators, not shown, in fluid communication with each of the air film rolls, or by a single pressure regulator 76 associated with the source of compressed air 64. As described above, when the internal chamber 56 of each of the air film rolls is pressurized, an air cushion is established between each pressurized roll and the web 12 so that the web is supported in non-contacting relationship with the pressurized rolls, as illustrated in FIG. 2.

When transporting or incrementally moving the web 12 using the incrementing station 20, air pressure is sequentially supplied to all of the porous air film rolls, as described above, thereby forming a non-contacting air-bearing support for the flexible film structure 12. In this manner, the flexible film structure 12 and the porous air film rolls are separated by a thin film of air having a thickness that is determined primarily by the pressure and flow rate of air applied to the cylinder wall portion 52, the first porous layer 66, the second porous layer 68, and the outer porous layer 70, and the tension in the film structure 12. The flexible film structure 12 is transported along the pathway by moving the incrementing station 20 along the pathway, until a preselected area of the flexible film structure 12 is positioned at the work station 18, whereupon the movement of the station 20 along the pathway is interrupted. Air is then turned off, sequentially, to the air film rollers 44, 42, 40, 38, 36, 34, and the clamp incrementing station 20 opened and returned to its home position. This permits the web 12 to be clamped by the incrementing station 20 on the take-up side of the workstation 18 in a manner whereby tension is provided by the respective first tensioning weight 26 as the air cushion collapses sequentially from the incrementing station 20 toward the supply spool 14. As shown in FIG. 3, when air flow to all of the rolls 34, 36, 38, 40, 42, 46 is interrupted, the web 12 is in intimate contact with each roll and is substantially rigidly clamped in a fixed position with respect to the first and second film support and clamping station 30, 32.

When preparing the system 10 for compliant clamping, typically desirable during POFX punching operation, the clamp on the indexing station 20 is closed and each of the porous air film rolls 34, 36, 38, 40, 42, 44 are sequentially pressurized. The station 20 is then moved to transport the flexible film structure 12 to a desired position. After indexing, the air flow is turned off sequentially to the distally spaced air film roll 44 and the intermediately spaced air film roll 42 of the second film support and clamping station 32, and then sequentially to the intermediately spaced air film roll 36 and the distally spaced air film roll 34 of the first film support and clamping station 30. This sequence permits the first tensioning weight 26 to apply a uniform tension on the web 12 while firmly clamped on the take-up side of the workstation 18 by the incrementing station 20 and, subsequently, by the depressurized air film rolls 44, 42 and then by the depressurized air film rolls 36, 34. The web 12 is thus compliantly supported on an air film at each of the proximally spaced air film rolls 38, 40 and frictionally clamped by the remaining rolls 34, 36, 42, 44 as shown in FIG. 3.

Sometimes it is desirable to be able to transition from rigid clamping to compliant clamping before indexing the web to a new position. For example some holes could be punched first in the POFY mode with the web rigidly clamped, and the remaining holes could be punched in the POFX mode with the web compliantly clamped. It may be desirable to do this because the web is naturally more flexible in the Y direction, and rigid clamping may be necessary to control hole locations in the Y direction for some applications.

After the POFY holes are punched, to make this transition, air film rolls 34, 36, 38 are sequentially pressurized and then air film rolls 36, 34 are sequentially turned off. Then air film rolls 44, 42, 40 are sequentially pressurized and air film rolls 42, 44 are sequentially turned off. The clamp on the incrementing station 20 should be open during this portion of the sequence to allow the second tensioning station 24 to supply and take up web material during the sequencing of air rolls 40, 42, 44.

The flexible film structure 12 is thus tightly wrapped around the distally spaced and intermediately spaced air film rolls positioned on each side of the work station 18, while compliantly supported on respective air cushions at each of the proximally spaced air film rolls 38, 40 as illustrated in FIG. 3. The intersurface friction and wrap angle of the flexible film structure 12 around the respective porous air film rolls 34, 36, 42, 44 effectively clamp the flexible film structure 12 and eliminate the need for a piston actuated, rigid clamping station on each side of the work station 18, as previously required. The flexible film structure 12 is thus supported on the left and right side of the work station 18 by two air bearing cushions provided at the respective proximally spaced air film rolls 38, 40 which are in stable equilibrium, with the flexible film structure 12 wrapped ¼ turn around the distally spaced porous air film rolls 34, 44, and a ½ turn around the intermediately spaced air film rolls 36, 42.

The air cushions provided by the proximally spaced air film rolls 38, 40 support the flexible film structure 12 in such a manner that it has a limited capability for compliant and resilient movement in the "X" direction during the time interval when a punch is engaged with a hole and yet will be exactly repositioned between each and every subsequent punching operation within a punch frame. The inertia of such a system is very low and consequently film repositioning is very rapid. The compliant retention provided by the air bearing cushions at the proximally spaced air film rolls 38, 40 permit the table speed of the punching station 18 to be increased from a rate of about 10 mm/sec when rigidly clamped by piston actuated stations closely spaced on each side of the work station 18, to about 40 mm/sec during punching in a POFX mode. Thus, the present invention enables punching of holes in the POFX mode at a rate that is four times faster than that permitted heretofore. Furthermore, punching-on-the-fly in the "Y" direction has been carried out at a rate of 20 mm/sec table speed with completely satisfactory results.

Alternatively, the system 10 for transporting and selectively clamping a flexible structure 12, in accordance with the present invention, permits the flexible film structure to be rigidly clamped, in a manner similar to that of the previous piston-actuated clamping stations, for certain operations in the POFX or POFY modes. This may be particularly desirable during punching the POFY mode since there is less need for resilient mounting in the "Y" direction because the web 12 is less restrained in the "Y" direction, i.e., there is no tension applied to the web in the "Y" direction.

After all the punched holes are formed at one position on the web 12, the web 12 is indexed to the next position, as described above, by closing the clamp 20 and sequentially pressurizing the air film rolls 34, 36, 38, 40, 42, 44. The clamp 20 is then indexed to the new position and the air film rolls sequentially depressurized in reverse order, i.e. from right to left as viewed in FIGS. 2 and 3, prior to rigidly or compliantly clamping the web 12 for a subsequent punching operation.

Thus, it can be seen that the system and method embodying the present invention effectively address the problem of restrictions in the rate at which movable tools can perform certain processing operations, such as hole punching, in thin web materials, while moving, i.e., on the fly. Not only are higher processing rates permissible when using the system and method embodying the present invention, but the conformity and consistency of the processing operations are also improved. Thus, both quality and productivity are increased.

Although the present invention is described in terms of a preferred exemplary embodiment, with specific illustrative key constructions of a porous air film roll and in a specific process application wherein holes are punched in a flexible structure, those skilled in the art will recognize that changes in those constructions and in process applications may be made without departing from the spirit of the invention. Such changes are intended to fall within the scope of the following claims. Other aspects, features and advantages of the present invention may be obtained from a study of this disclosure and the drawings, along with the appended claims.

What is claimed is:

1. A system for transporting a flexible film structure along a pathway extending in a preselected direction and selectively clamping said film structure at a preselected position along said pathway designated for processing of said film structure, comprising:
    a workstation adapted to perform processing operations on said film structure, said workstation being controllably movable in a direction of at least one of parallel to said pathway and perpendicular to said pathway, and having first and second sides spaced apart from each other in a direction extending along said pathway;
    a support and clamping system including a means of resiliently clamping the film structure, said clamping system providing:
        a. an initial clamp position of said film structure;
        b. compliant movement of the film structure when said film structure is acted upon by forces imparted by the workstation;
        c. a means of restoring the film structure to the said initial clamp position when said forces imparted by the workstation are removed.

2. The system according to claim 1, wherein the means of resiliently clamping the film structure includes at least one film support and clamping station spaced apart from one side of the workstation in a direction along the pathway and including:
    a plurality of first porous members each having
        a cylindrical wall portion at least partially defining an interior chamber and having a longitudinal axis extending in a direction parallel to the cylindrical wall portion and perpendicular to the pathway
        a plurality of air passageways extending through the cylindrical wall portion between the interior chamber and a cylindrically-shaped outer surface of the cylindrical wall portion,
        an air inlet port in fluid communication with the internal chamber of each first porous member and a controlled source of compressed air;
    the film structure being supported on an air cushion at each of the first portion members in response to providing a flow of air into the interior chamber of the respective first porous member and clamped in a fixed position with respect to the at least one film support and clamping station in response to interrupting the flow of air into the interior chamber of at least one porous member.

3. The system according to claim 2, wherein the at least one film support and clamping station includes three porous members arranged in a substantially co-planar relationship with respect to each other.

4. The system according to claim 2, wherein each of the porous members has a cover member covering the cylindrical wall portion, each cover member having an air porosity less than that provided by the plurality of air passageways extending through the cylindrical wall portion of the respective porous member.

5. The system according to claim 4, wherein each cover member has a multi-layered construction comprising a first porous layer disposed adjacent the cylindrical wall portion and including a plurality of closely spaced apertures extending therethrough, a second porous layer arranged over the first porous layer and having a porosity less than the first porous layer, and a third porous layer arranged over the second layer and having a greater porosity than the second porous layer.

6. The system according to claim 2, wherein the means for restoring the film structure to the initial clamp position includes at least one tensioning weight bearing on the film structure.

7. The system according to claim 1, wherein the means of resiliently clamping the film structure includes two film support and clamping stations spaced apart from opposite sides of the workstation in a direction along the pathway.

8. The system according to claim 7, wherein each film support and clamping station includes three porous members arranged in a substantially co-planar relationship with respect to each other.

9. A device for rigid clamping and low friction transport of a film, said device comprised of a cylindrical air bearing and a film translation system, said film translation system providing a wrap of the film around a portion of a circumference of the air bearing, wherein when gas flows through the air bearing said air bearing provides for low friction transport of the film across the air bearing surface and wherein when no gas flows through the air bearing, the film is pulled against the air bearing surface by tension provided by the film translation system, thus frictionally locking or clamping the film and retarding further movement or translation of the film.

10. The device according to claim 9, wherein the cylindrical air bearing and film translation system includes a plurality of first porous members each having
   a cylindrical wall portion at least partially defining an interior chamber and having a longitudinal axis extending in a direction parallel to the cylindrical wall portion and perpendicular to a pathway of movement of the film,
   a plurality of air passageways extending through the cylindrical wall portion between the interior chamber and a cylindrically-shaped outer surface of the cylindrical wall portion,
   an air inlet port in fluid communication with the internal chamber of each first porous member and a controlled source of compressed air;
   the film being supported on an air cushion at each of the first porous members in response to providing a flow of air into the interior chamber of the respective first porous member and clamped in a fixed position in response to interrupting the flow of air into the interior chamber of at least one porous member.

11. The device according to claim 10, wherein the cylindrical air bearing and film translation system includes two film support and clamping stations spaced apart from opposite sides of a workstation in a direction along the pathway and each comprising one of the first porous members.

12. The system according to claim 10, wherein each cylindrical air bearing and film translation system includes three porous members arranged in a substantially coplanar relationship with respect to each other.

13. The system according to claim 10, wherein each of the porous members has a cover member covering the cylindrical wall portion, each cover member having an air porosity less than that provided by the plurality of air passageways extending through the cylindrical wall portion of the respective porous member.

14. The system according to claim 13, wherein each cover member has a multi-layered construction comprising a first porous layer disposed adjacent the cylindrical wall portion and including a plurality of closely spaced apertures extending therethrough, a second porous layer arranged over the first porous layer and having a porosity less than the first porous layer, and a third porous layer arranged over the second layer and having a greater porosity than the second porous layer.

15. The device according to claim 9, further comprising:
   a workstation for performing processing operations on the film, the workstation being controllably movable in a direction including at least one of parallel to a direction of transport of the film and perpendicular to a direction of transport of the film.

16. A device for compliantly and resiliently clamping a film, comprised of a pressurized cylindrical air bearing supporting the film on an air cushion and a film tensioning and clamping system, said tensioning and clamping system providing for:
   a. a wrap of the film around a portion of a circumference of the air bearing;
   b. tension in the film;
   c. rigid clamping of the film at positions on opposite sides of said air bearing;
   said air bearing and air cushion providing for compliant and resilient movement of the film on opposite sides of the air bearing in response to perturbations in film tension.

17. The device according to claim 16, further comprising:
   a workstation for performing processing operations on the film, the workstation being controllably movable in a direction including at least one of parallel to a direction of transport of the film and perpendicular to a direction of transport of the film.

18. The device according to claim 16, wherein the film tensioning and clamping system includes a plurality of first porous members each having
   a cylindrical wall portion at least partially defining an interior chamber and having a longitudinal axis extending in a direction parallel to the cylindrical wall portion and perpendicular to a pathway of movement of the film,
   a plurality of air passageways extending through the cylindrical wall portion between the interior chamber and a cylindrically-shaped outer surface of the cylindrical wall portion,
   an air inlet port in fluid communication with the internal chamber of each first porous member and a controlled source of compressed air;
   the film being supported on an air cushion at each of the first portion members in response to providing a flow of air into the interior chamber of the respective first porous member and clamped in a fixed position in response to interrupting the flow of air into the interior chamber of at least one porous member.

19. The device according to claim 18, wherein the film tensioning and clamping system includes two film support and clamping stations spaced apart from opposite sides of a workstation in a direction along the pathway and each comprising one of the first porous members.

20. The system according to claim 19, wherein each film support and clamping station includes three porous members including the first porous members arranged in a substantially co-planar relationship with respect to each other, wherein each of the three porous members of each film support and clamping station has a cover member covering the cylindrical wall portion, each cover member having an air porosity less than that provided by the plurality of air passageways extending through the cylindrical wall portion of the porous member it covers, and wherein each cover member has a multi-layered construction comprising a first porous layer disposed adjacent the cylindrical wall portion and including a plurality of closely spaced apertures extending therethrough, a second porous layer arranged over the first porous layer and having a porosity less than the first porous layer, and a third porous layer arranged over the second layer and having a greater porosity than the second porous layer.

* * * * *